(12) United States Patent
Liu et al.

(10) Patent No.: US 8,691,646 B2
(45) Date of Patent: Apr. 8, 2014

(54) FINFET COMPATIBLE PC-BOUNDED ESD DIODE

(75) Inventors: Yanxiang Liu, Wappingers Falls, NY (US); Jerome Ciavatti, Fishkill, NY (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/463,592

(22) Filed: May 3, 2012

(65) Prior Publication Data

US 2013/0292745 A1 Nov. 7, 2013

(51) Int. Cl.
*H01L 21/8234* (2006.01)

(52) U.S. Cl.
USPC .......... 438/237; 438/147; 438/164; 438/197; 438/275; 438/283

(58) Field of Classification Search
USPC .................. 438/147, 164, 197, 237, 275, 283
See application file for complete search history.

(56) References Cited

U.S. PATENT DOCUMENTS

| 7,173,310 | B2 * | 2/2007 | Voldman et al. | 257/350 |
| 7,560,784 | B2 | 7/2009 | Cheng et al. | |
| 7,700,449 | B2 | 4/2010 | Lee | |
| 8,551,841 | B2 * | 10/2013 | Lee et al. | 438/283 |

* cited by examiner

*Primary Examiner* — Bac Au
(74) *Attorney, Agent, or Firm* — Ditthavong Mori & Steiner, P.C.

(57) ABSTRACT

A semiconductor device is formed having compatibility with FINFET process flow, while having a large enough junction area of to reduce the discharge ESD current density. Embodiments include forming a removable gate over an N− doped fin on a substrate, forming P+ doped SiGe or Si on an anode side of the fin, and forming N+ doped Si on a cathode side of the fin. The area efficiency of the semiconductor device layout is greatly improved, and, thereby, discharge of ESD current density is mitigated.

15 Claims, 10 Drawing Sheets

FINFET COMPATIBLE PC-BOUNDED ESD DIODE

TECHNICAL FIELD

The present disclosure relates to electrostatic discharge (ESD) diodes that are compatible with conventional FINFET process flow. The present disclosure is particularly applicable to 14 nanometer (nm) technology nodes and beyond.

BACKGROUND

PC-bounded diodes are one of the major ESD devices for planar CMOS technology due to their particular advantages for use with ESDs. For example, PC-bounded diodes have low on-state resistance (Ron) and high failure current for devices similar in size. In addition, PC-bounded diodes have low voltage overshoot, which is another desired quality for ESD applications. FIG. 1 depicts a conventional PC-bounded diode that may be used, for example, with both 20 nm and 28 nm planar CMOS technology nodes. As illustrated, the diode is formed between shallow trench isolation (STI) regions 101 in NWell 103 in a P-type substrate 105. On one side, a cathode 107 is formed over N+ region 109, on the other side, an anode 111 is formed over P+ region 113, and in between the cathode and the anode, a gate 115 is formed, electrically connected to the anode. A direct current flow from the anode to the cathode is shown by arrows 117, and the gate length is indicated by arrow 119.

Adverting to FIG. 2, a layout of a conventional PC-bounded diode that may be used in 20 nm CMOS technology is depicted. As illustrated, a gate structure 201, including multiple contacts 203, is formed over an active region 205, for example, a source/drain region. The active region 205 is formed over an NWell 207, which is formed over a substrate 209.

Although conventional PC-bounded diodes are commonly used for 20 nm and 28 nm planar CMOS technology nodes, at smaller technology nodes, such as 14 nm technology nodes, FINFETs are preferably used due to their superior immunity to short-channel effects. In such devices, the depletion-layout width is limited to within the fin width.

Contrary to conventional PC-bounded diodes used for planar CMOS technology nodes, FINFETs are non-planar transistors built on a substrate, for example, silicon on insulator (SOI) substrate or bulk substrate. FINFETs are typically used to construct PC-bounded diodes with similar methods as those utilized in planar technology and with the cathodes and anodes of a particular PC-bounded diode being doped in the same manner. Using such similar methods as those utilized in planar technology, a source terminal includes a well (i.e., no junction), and a drain-well junction serves as an ESD diode junction. However, under this approach, both design and process issues arise because the resulting junction area of the FINFET is too small. The junction area of a conventional PC-bounded diode can be calculated as the fin width times the fin height (i.e., junction area=fin height×fin width). A limiting factor with this approach is that in order to provide a high ESD protection capability, a large number of FINFETs must be connected in parallel, which thereby results in a reduced efficiency of the PC-bounded diode's layout (i.e., reduction in area efficiency).

A need therefore exists for methodology enabling the formation of ESD diodes that are compatible with FINFET process flow while having a large enough junction area to reduce the discharge ESD current density, and the resulting device.

SUMMARY

An aspect of the present disclosure is an improved method of fabricating a semiconductor that is compatible with conventional FINFET process flow and has a sufficiently large junction area.

Another aspect of the present disclosure is a semiconductor device that is compatible with conventional FINFET process flow and that is sufficiently large junction area.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a removable gate over an N– doped fin on a substrate; forming P+ doped silicon germanium (SiGe) or silicon (Si) on an anode side of the fin; and forming N+ doped Si on a cathode side of the fin.

Aspects of the present disclosure include forming the P+ doped SiGe or Si by epitaxially growing SiGe or Si in situ on the fin. Further aspects include covering the gate and cathode side of the fin with a hard mask prior to epitaxially growing the P+ doped SiGe or Si on the anode side of the fin, and wherein the hard mask includes silicon nitride (SiN). Another aspect includes forming the N+ doped Si by epitaxially growing Si on a cathode side of the fin. Other aspects include covering the anode side of the fin with a hard mask prior to epitaxially growing the N+ doped Si on the cathode side of the fin, and wherein the hard mask includes SiN. Additional aspects include forming the P+ doped SiGe or Si prior to forming the N+ doped Si. Yet further aspects include forming the N+ doped Si prior to forming the P+ doped SiGe or Si. Additional aspects include plasma doping source/drain regions as N type prior to forming the P+ doped SiGe or Si. Further aspects include forming nitride spacers on opposite sides of the gate prior to forming the P+ doped SiGe or Si and the N+ doped Si. Yet other aspects include connecting the anode side of the fin and the gate together.

Another aspect of the present disclosure is a device including an N– doped fin on a substrate; a gate formed over the fin; P+ doped SiGe or Si on an anode side of the fin; and N+ doped Si on a cathode side of the fin.

Aspects include a device including the P+ doped SiGe or Si and the N+ doped Si being epitaxially grown in situ on the fin. Additional aspects include a device including the P+ doped SiGe or Si being epitaxially grown on the anode side of the fin by covering the cathode side of the fin with a hard mask, and the N+ doped Si being epitaxially grown in situ on the cathode side of the fin by covering the anode side with a hard mask. Further aspects include nitride spacers on opposite sides of the gate.

Another aspect of the present disclosure is a method including: forming a removable gate over an N– doped fin on a substrate; covering the gate and cathode side of the fin with a hard mask; forming P+ doped SiGe or Si on an anode side of the fin by epitaxially growing SiGe or Si in situ on the fin; covering the anode side of the fin with another hard mask; and forming N+ doped Si on a cathode side of the fin by epitaxially growing Si on a cathode side of the fin.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of incompatibility with FINFET process flow and small junction areas that are incapable of discharging ESD current density attendant upon current processes for ESD diode formation. In accordance with embodiments of the present disclosure, FINFET compatible PC-bounded ESD diodes are formed by masking each side of the fin while epitaxially growing appropriately doped Si or SiGe on the other side. The resultant structure has junction areas that are larger than junction areas of conventional PC-bounded diodes. Therefore, area efficiency of the diode layout is greatly improved and discharge of ESD current density is mitigated.

Embodiments of the present disclosure include forming a removable gate, for example of polysilicon, over an N− doped fin on a substrate. P+ doped SiGe or Si is formed on an anode side of the fin. N+ doped Si is formed on a cathode side of the fin.

Figure 1:
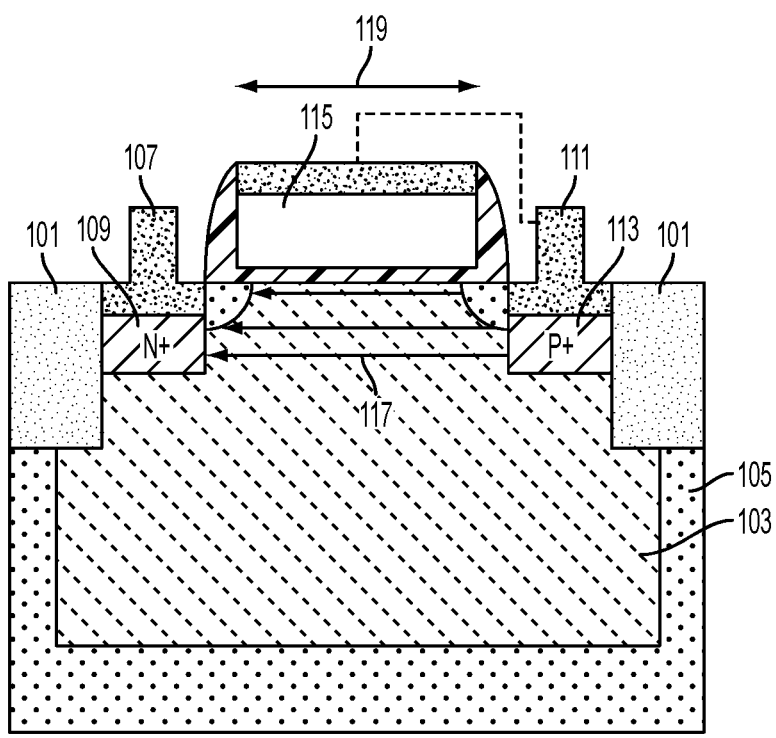
FIG. 1 schematically illustrates a conventional PC-bounded diode.
Figure 2:
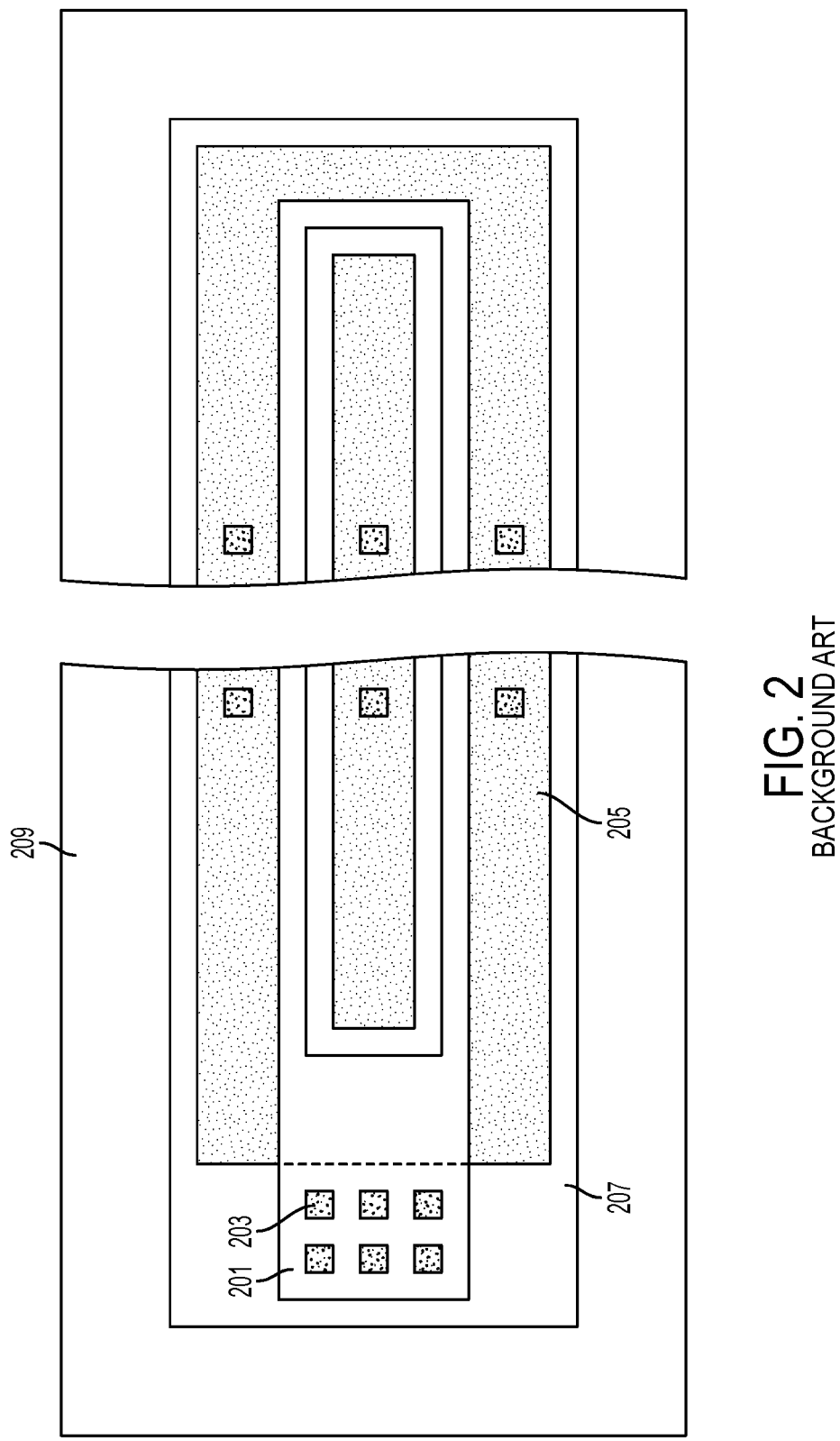
FIG. 2 schematically illustrates a layout of a conventional PC-bounded diode in 20 nm CMOS technology.
Figure 3A:
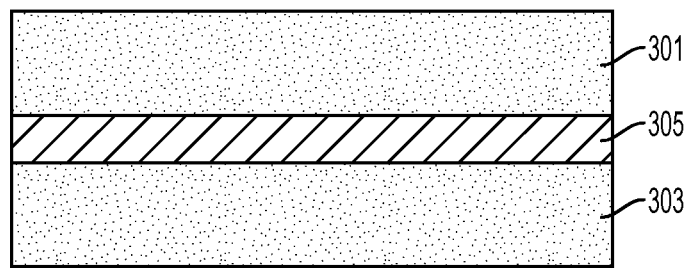
FIGS. 3A through 3G schematically illustrate a cross-sectional view of a process flow for forming a FINFET compatible PC-bounded diode, and FIG. 3H schematically illustrates a three-dimensional view of the resultant structure, in accordance with an exemplary embodiment.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive A process flow for fabricating a semiconductor device in accordance with embodiments of the present disclosure is depicted in FIG. 3A through 3H. As depicted in FIG. 3A, a fin 301, for example of silicon, is formed on a substrate 303 over a local oxide isolation block 305. The fin 301 is an intrinsically N− type or N− doped fin, for example of silicon. The substrate 303 may be, for example, a silicon wafer. The fin 301 may be doped with, for example phosphorous, at a concentration level of 1e15 to 1e18.

Figure 3B:
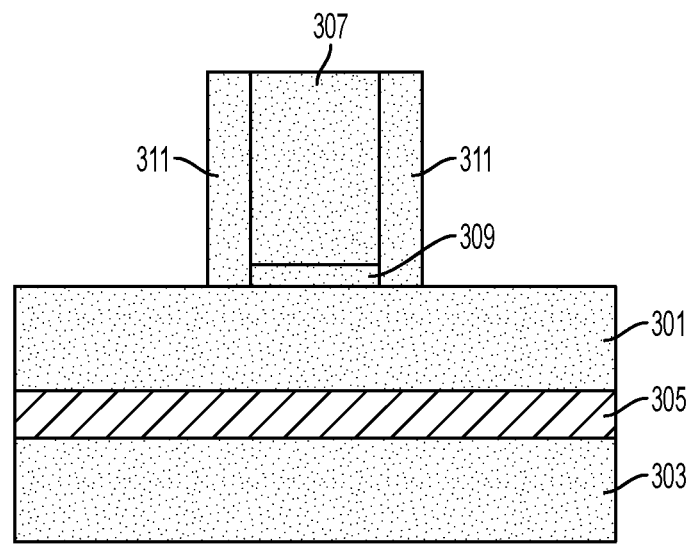

As depicted in FIG. 3B, a removable dummy gate 307, for example of polysilicon, is formed over the fin 301 on the substrate 303. The removable gate 307 is formed over a gate oxide layer 309 by forming an oxide layer, a polysilicon layer over the oxide, and patterning the two layers. Source/drain regions of the fin 301 are plasma doped as N type. To encapsulate the gate 307, nitride spacers 311 are formed on opposite sides of the gate 307.

Figure 3C:
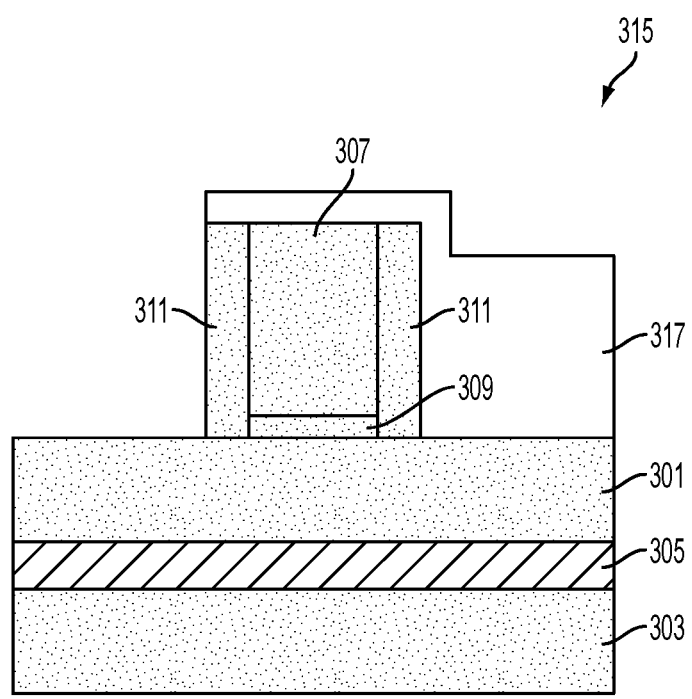
Figure 3D:
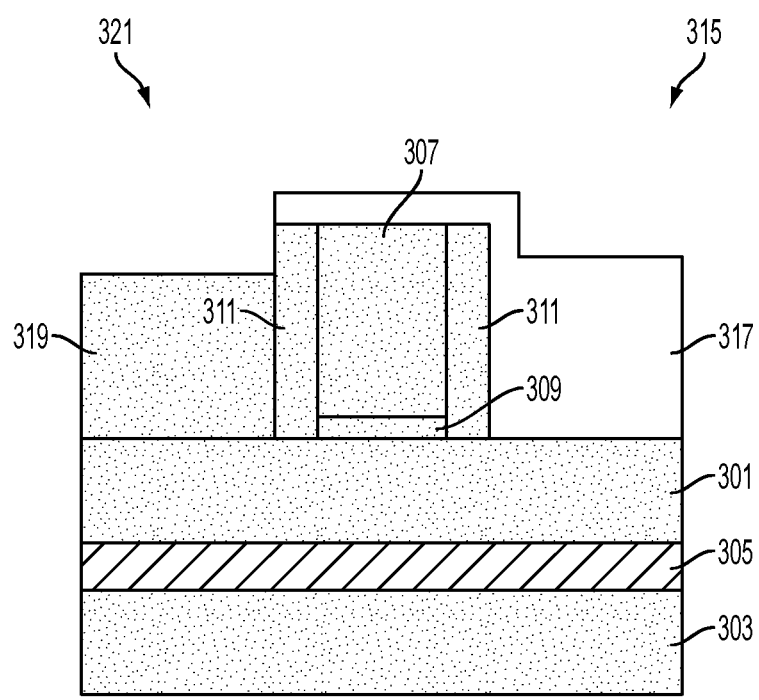

Adverting to FIG. 3C, the gate 307 and a cathode side 315 of the fin 301 are covered with a hard mask 317. The hard mask 317, for example, may be formed of silicon nitride (SiN). FIG. 3D depicts P+ doped SiGe or Si 319 being formed on an anode side 321 of the fin 301. The P+ doped SiGe or Si 319 is formed by epitaxially growing in situ P+ doped SiGe or Si on the fin 301.

Figure 3E:
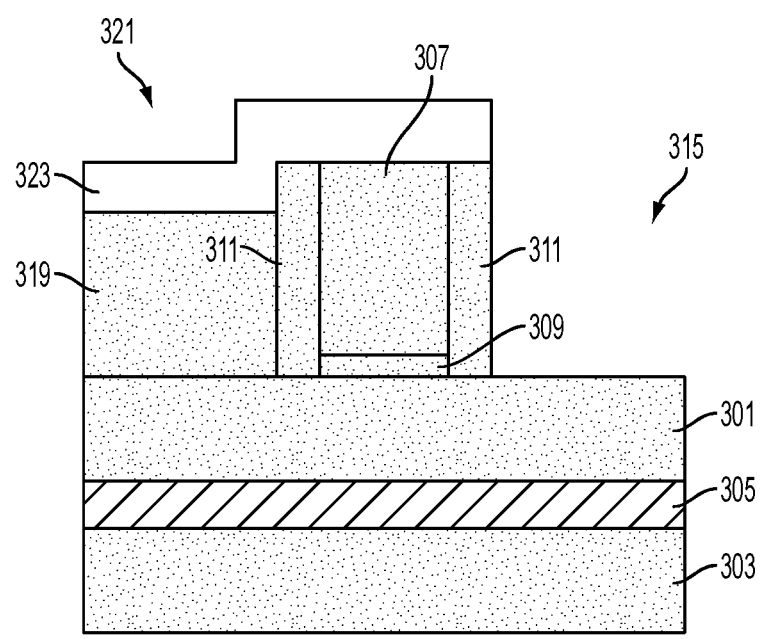
Figure 3F:
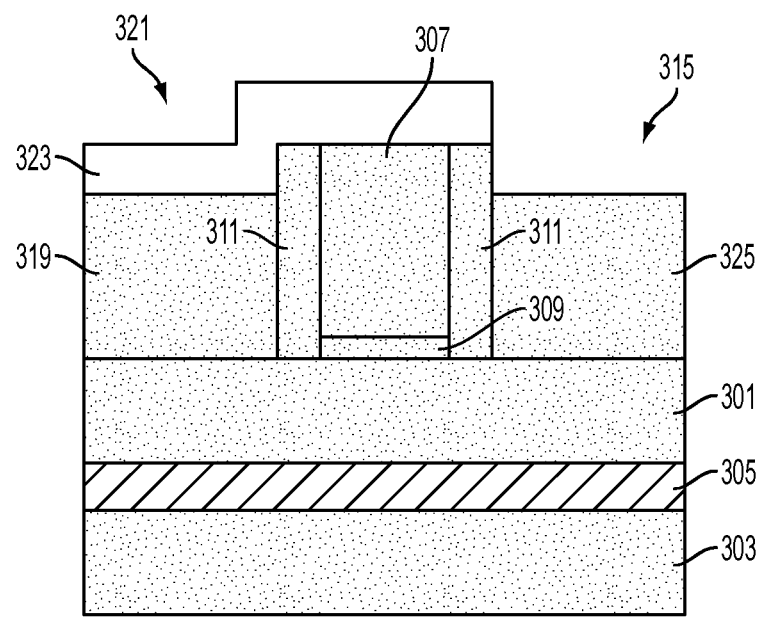
Figure 3G:
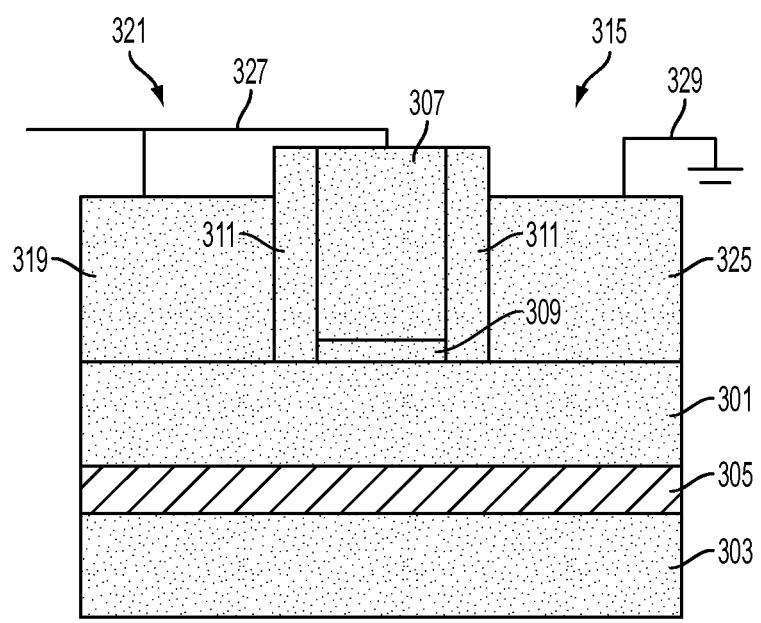

Adverting to FIG. 3E, the anode side 321 of the fin 301 is covered with a hard mask 323. The hard mask 323, for example, may be formed of SiN. FIG. 3F depicts N+ doped Si 325 being formed on the cathode side 315 of the fin 301. The N+ doped Si 325 is formed by epitaxially growing the Si in situ on the fin 301. In embodiments, the covering of the anode side 321 of the fin 301 with the hard mask 323 and forming of N+ doped Si 325 can be performed prior to or subsequent to the covering of the gate 307 and cathode side 315 of the fin 301 and forming of P+ doped SiGe or Si 319. Adverting to FIG. 3G, the anode side 319 of the fin 301 is connected to the gate 307 via terminal 327, while the cathode side 315 includes a terminal 329. Once the cathode is formed, conventional FINFET CMOS processes (not shown for illustrative convenience) continue. For example, an interlayer dielectric (ILD) is deposited, the dummy gate 307 is replaced with an N type gate, for example a high-k/metal gate, contacts are etched, and silicidation is performed.

Figure 3H:
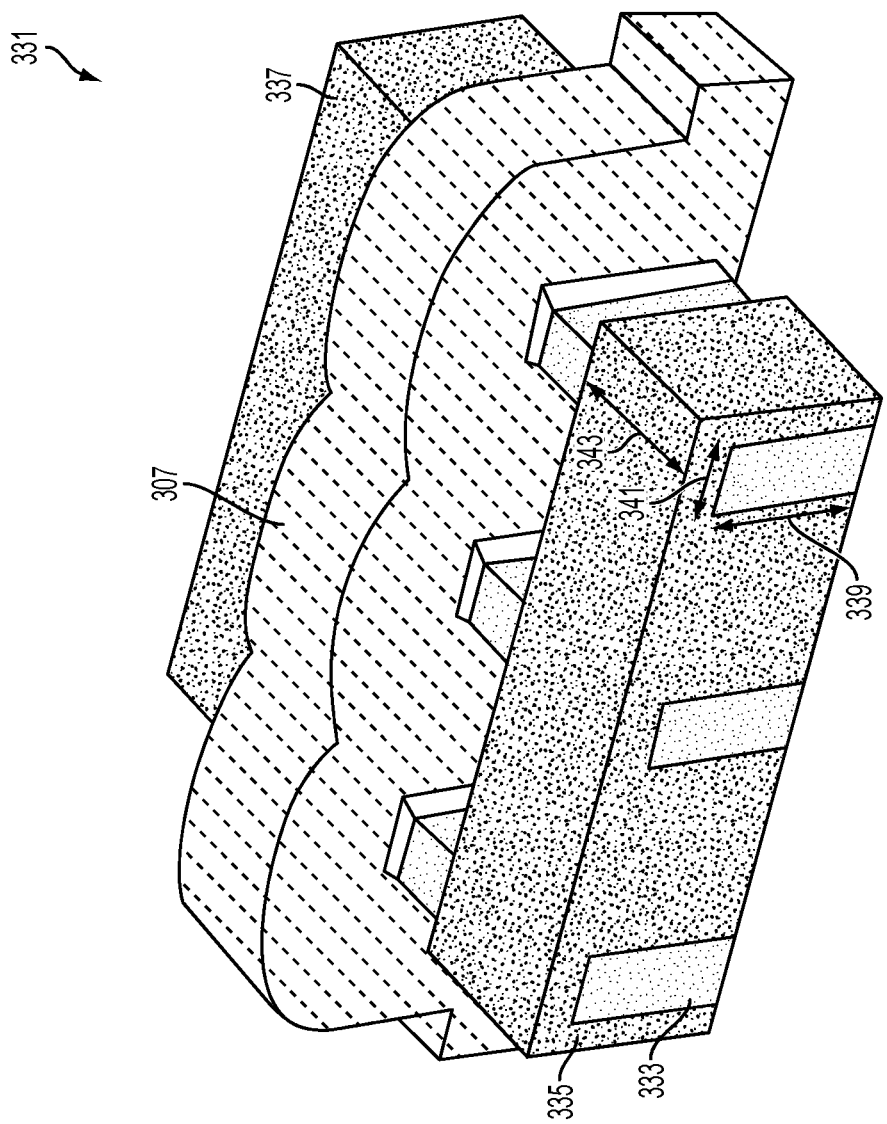

FIG. 3H depicts a three dimensional view of a resultant P+/N diode 331 including n fins 333 (where n may, for example, range from 1 to 20, but is not limited to 20), which is a FINFET compatible PC-bounded diode. The P+N/diode includes a P+ anode 335 and a N+ cathode 337 and gate 307 therebetween. The P+/N diode 331 has a junction area that can be calculated as 2 times the fin height 339 plus the fin width 341, times the fin length 343 at junction (i.e., junction area=(2×fin height+fin width)×fin length at junction. As illustrated in FIG. 3H, the fin length at the junction may be 20 to 200 nm, which may be much longer than the fin height (which may be 5 to 50 nm) or fin width (which may be 5 to 30 nm). Accordingly, the junction area of the P+/N diode 331 is much larger than a conventional junction area of a FINFET that can be calculated as the fin width times the fin height (i.e., junction area=fin height×fin width). Therefore, the layout of the P+/N diode 331, in comparison with a conventional FINFET, has higher area efficiency and thereby increased ability to mitigate discharge of ESD current density.

Although the description has been directed to the formation of a P+/N diode, the disclosure also applies to a N+/P diode by substituting P type for N type elements and dopants, and vice versa. For example, the fin may be an intrinsically P– type or P– doped fin rather than an N– type fin, the source/drain regions may be doped as P type rather than N type, and so forth.

The embodiments of the present disclosure can achieve several technical effects, including enablement of the formation of ESD diodes that are compatible with FINFET process flow while having a large enough junction area of ESD diode to reduce the discharge ESD current density. The present disclosure enjoys industrial applicability in fabricating any of various types of highly integrated semiconductor devices, particularly for 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a removable gate over an N– doped fin on a substrate;
   forming P+ doped silicon germanium (SiGe) or silicon (Si) on an anode side of the fin;
   forming N++ doped Si on a cathode side of the fin, wherein forming the N+ doped Si includes epitaxially growing the Si; and
   forming nitride spacers on opposite sides of the gate prior to forming the P+ doped SiGe or Si and the N+ doped Si.

2. The method according to claim 1, comprising forming the P+ doped SiGe or Si by epitaxially growing SiGe or Si in situ on the fin.

3. The method according to claim 2, further comprising covering the gate and cathode side of the fin with a hard mask prior to epitaxially growing the P+ doped SiGe or Si on the anode side of the fin.

4. The method according to claim 3, wherein the hard mask comprises silicon nitride (SiN).

5. The method according to claim 1, wherein forming the N+ doped Si includes epitaxially growing the Si in situ on the cathode side of the fin.

6. The method according to claim 5, further comprising covering the anode side of the fin with a hard mask prior to epitaxially growing the N+ doped Si on the cathode side of the fin.

7. The method according to claim 6, wherein the hard mask comprises SiN.

8. The method according to claim 1, comprising forming the P+ doped SiGe or Si prior to forming the N+ doped Si.

9. The method according to claim 1, comprising forming the N+ doped Si prior to forming the P+ doped SiGe or Si.

10. The method according to claim 1, further comprising plasma doping source/drain regions as N type prior to forming the P+ doped SiGe or Si.

11. The method according to claim 1, further comprising connecting the anode side of the fin and the gate together.

12. A method comprising:
    forming a removable gate over an N– doped fin on a substrate;
    covering the gate and cathode side of the fin with a hard mask;
    epitaxially growing in situ P+ doped silicon germanium (SiGe) or silicon (Si) on an anode side of the fin;
    covering the anode side of the fin with another hard mask; and
    epitaxially growing in situ N+ doped Si on a cathode side of the fin.

13. The method according to claim 12, wherein both the hard mask and the another hard mask comprise silicon nitride (SiN).

14. The method according to claim 12, comprising forming the P+ doped SiGe or Si prior to forming the N+ doped Si.

15. The method according to claim 12, comprising forming the N+ doped Si prior to forming the P+ doped SiGe or Si.

* * * * *